(12) United States Patent
Lubberhuizen et al.

(10) Patent No.: US 9,185,493 B2
(45) Date of Patent: Nov. 10, 2015

(54) METHOD AND APPARATUS FOR COMPUTING METRIC VALUES FOR LOUDSPEAKER PROTECTION

(71) Applicant: Dialog Semiconductor B.V., 's-Hertogenbosch (NL)

(72) Inventors: Wessel Lubberhuizen, Delden (NL); Marinus Wilhelmus Kruiskamp, 's-Hertogenbosch (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 413 days.

(21) Appl. No.: 13/654,671

(22) Filed: Oct. 18, 2012

(65) Prior Publication Data
US 2014/0086418 A1    Mar. 27, 2014

(30) Foreign Application Priority Data
Sep. 21, 2012  (EP) .................................. 12368025

(51) Int. Cl.
*H04R 9/00*  (2006.01)
*H04R 9/02*  (2006.01)
(Continued)

(52) U.S. Cl.
CPC ............... *H04R 9/022* (2013.01); *H04R 3/007* (2013.01); *H04R 29/003* (2013.01); *G01R 1/00* (2013.01); *G01R 19/00* (2013.01); *G01R 19/06* (2013.01); *G01R 19/165* (2013.01);
(Continued)

(58) Field of Classification Search
CPC .......... H04R 3/00; H04R 3/007; H04R 9/022; H04R 29/003; H04R 29/001; H03G 11/00; H03G 1/00; H03F 1/52; H03F 2200/426; H03F 2200/447; G01R 19/16528; G01R 19/165; G01R 19/06; G01R 19/00; G01R 1/00
USPC ...................................................... 381/55, 59
See application file for complete search history.

(56) References Cited

U.S. PATENT DOCUMENTS 4,301,330 A * 11/1981 Trump ............................ 381/55
4,583,245 A * 4/1986 Gelow et al. .................... 381/59
(Continued)

FOREIGN PATENT DOCUMENTS

| GB | 2 187 607 | | 9/1987 | |
|----|-----------|---|--------|---|
| GB | 2187607 A | * | 9/1987 | ............... H04R 3/00 |
| JP | 05264491 | | 10/1993 | |

OTHER PUBLICATIONS

Klipel, Nonlinear Modeling of the Heat Transfer in Loudspeakers, Journal of the Audio Engineering Society, vol. 52, pp. 3-25, Feb. 2004.*

(Continued)

*Primary Examiner* — Davetta W Goins
*Assistant Examiner* — Oyesola C Ojo
(74) *Attorney, Agent, or Firm* — Saile Ackerman LLC; Stephen B. Ackerman

(57) ABSTRACT

Systems and methods thereof for obtaining metrics and an accurate threshold to prevent loudspeaker overheating, based on autocorrelation and cross-correlation of band-pass filtered current and voltage measurements are disclosed. The methods invented are based on instantaneous voltage and current measurements. The invention does not require a DC or pilot signal to be added to the audio signal in order to do perform the measurement, and it is not disturbed by capacitive or inductive components in the complex impedance of the voice coil.

33 Claims, 4 Drawing Sheets

(51) Int. Cl.
    *H04R 3/00*     (2006.01)
    *H04R 29/00*     (2006.01)
    *H03F 1/52*     (2006.01)
    *G01R 1/00*     (2006.01)
    *G01R 19/00*     (2006.01)
    *G01R 19/06*     (2006.01)
    *G01R 19/165*     (2006.01)

(52) U.S. Cl.
    CPC ............ *G01R 19/16528* (2013.01); *H03F 1/52* (2013.01); *H04R 29/001* (2013.01)

(56) References Cited

U.S. PATENT DOCUMENTS

| | | | | |
|---|---|---|---|---|
| 4,843,562 | A | * | 6/1989 | Kenyon et al. .................. 702/73 |
| 4,980,920 | A | * | 12/1990 | Noro et al. ....................... 381/96 |
| 5,343,404 | A | * | 8/1994 | Girgis ............................ 702/72 |
| 5,481,617 | A | * | 1/1996 | Bjerre ........................... 381/108 |
| 5,577,126 | A | | 11/1996 | Klippel |
| 6,865,274 | B1 | * | 3/2005 | Aarts et al. ...................... 381/55 |
| 7,436,967 | B2 | | 10/2008 | Neunaber |
| 2004/0086140 | A1 | * | 5/2004 | Fedigan et al. ................. 381/96 |
| 2004/0178852 | A1 | * | 9/2004 | Neunaber ..................... 330/284 |
| 2009/0257599 | A1 | * | 10/2009 | Sand Jensen et al. ........... 381/55 |
| 2009/0304127 | A1 | * | 12/2009 | Massam et al. ............... 375/343 |
| 2011/0090604 | A1 | | 4/2011 | Butler |
| 2011/0182435 | A1 | | 7/2011 | Gautama |
| 2011/0228945 | A1 | * | 9/2011 | Mihelich et al. ................ 381/59 |
| 2014/0146971 | A1 | * | 5/2014 | Marguery et al. ............... 381/55 |

OTHER PUBLICATIONS

European Search Report 12368025.8-1910 Mail date—Feb. 13, 2013, Dialog Semiconductor GmbH.

"Complete Thermal Protection of an Active Loudspeaker," by Peter Chapman, Presented at the 108th Convention Feb. 19-22, 2000, Paris, France, AES, An Audio Engineering Society Preprint, 5112 (G-7), pp. 1-21.

\* cited by examiner

METHOD AND APPARATUS FOR COMPUTING METRIC VALUES FOR LOUDSPEAKER PROTECTION

BACKGROUND (1) Field of the Invention

This invention relates generally to loudspeaker systems and relates more specifically to methods and apparatus for computing a metric value for loudspeaker protection.

(2) Description of the Prior Art

It is well known that loudspeakers can be damaged due to overheating when driven at high output levels, especially for audio applications that contain high frequency components. Current practice is to prevent loudspeaker damage by simply hard or soft limiting the maximum power output to the loudspeaker.

As a result the maximum sound pressure level (SPL) that can be produced is severely limited even if the actual temperature of the loudspeaker is below the damage threshold. More advanced systems incorporate a simple thermal model of the loudspeaker which may not be accurate, or a temperature sensor to activate the limiter, which introduces additional complexity and cost.

Therefore it would be desirable to achieve a method for obtaining a threshold value for loudspeaker protection, based on instantaneous voltage and current measurements.

It is also challenge for engineers to achieve loudspeaker protection at reasonable cost without requiring additional devices to the loudspeaker.

SUMMARY

A principal object of the present invention is to prevent over-heating of a loudspeaker.

A further object of the present invention is to obtain a threshold value that is representative of an actual maximum allowable temperature of a voice coil of a loudspeaker.

A further object of the present invention is to obtain the threshold value by using auto-correlation and cross-correlation of band-pass filtered current and voltage measurements.

A further object of the invention is to activate a protection circuit if the threshold representative of the maximum temperature of the voice coil is exceeded.

In accordance with the objects of this invention, a method for computing metrics for loudspeaker protection has been achieved. The method invented comprises, firstly, the following steps: (1) providing a loudspeaker, a voltage and a current meter, a speaker protection monitor comprising computational and filtering means, and a speaker protection device, (2) measuring speaker input current and voltage, and (3) filtering by band-pass filters speaker input voltage and current values measured. Furthermore the method invented comprises the steps of: (4) using cross-correlation and autocorrelations equations based on band-passed measurement results to compute loudspeaker protection metrics including a real part of impedance of a voice coil of the loudspeaker, (5) activating speaker protection device if the real part of the loudspeaker impedance exceeds a threshold, and (6) going back to step (2) if input signals of speaker are active.

In accordance with the objects of this invention a system for preventing any damage of a loudspeaker because of over-heating of a voice coil has been achieved, The system invented comprises a speaker protection monitor configured to using cross-correlation and autocorrelations equations based on band-passed measurement results of loudspeaker voltage and loudspeaker current and to compute loudspeaker protection metrics and a speaker protection device lowering, if activated by the speaker protection monitor, a temperature of the voice coil.

In accordance with the objects of this invention a system for preventing any damage of a loudspeaker because of over-heating of a voice coil has been achieved, The system invented comprises, firstly, a loudspeaker comprising at least one voice coil and two signal input ports, a voltage meter measuring a signal input voltage of the loudspeaker and transmitting voltage measurement results to a speaker protection monitor, and a current meter measuring a signal input current of the loudspeaker and transmitting current measurement results to a speaker protection monitor. Furthermore the system comprises said speaker protection monitor comprising: a band-pass filter, an averaging filter, an output port to transmit a signal to a speaker protection device in order to activate the speaker protection device if required, and means to compute cross correlation and autocorrelation calculations comprising computing the loudspeaker threshold. Moreover the system comprises said speaker protection device lowering, if activated, a temperature of the voice coil.

BRIEF DESCRIPTION OF THE DRAWINGS

In the accompanying drawings forming a material part of this description, there is shown.

DESCRIPTION OF THE PREFERRED EMBODIMENTS

A method and system for obtaining a threshold value for loudspeaker protection, based on instantaneous voltage and current measurements, wherein autocorrelation and cross-correlation of band-pass filtered current and voltage measurements are used to obtain a real part of the complex impedance of the voice coil, are disclosed. An important point of the invention is that it does not require a DC or pilot signal to be added to the audio signal in order to perform the measurement, and that it is not disturbed by capacitive or inductive components in the complex impedance of the loudspeaker.

The metric is related to temperature. The real part of the impedance increases with temperature, causing a decrease in power.

Figure 1:
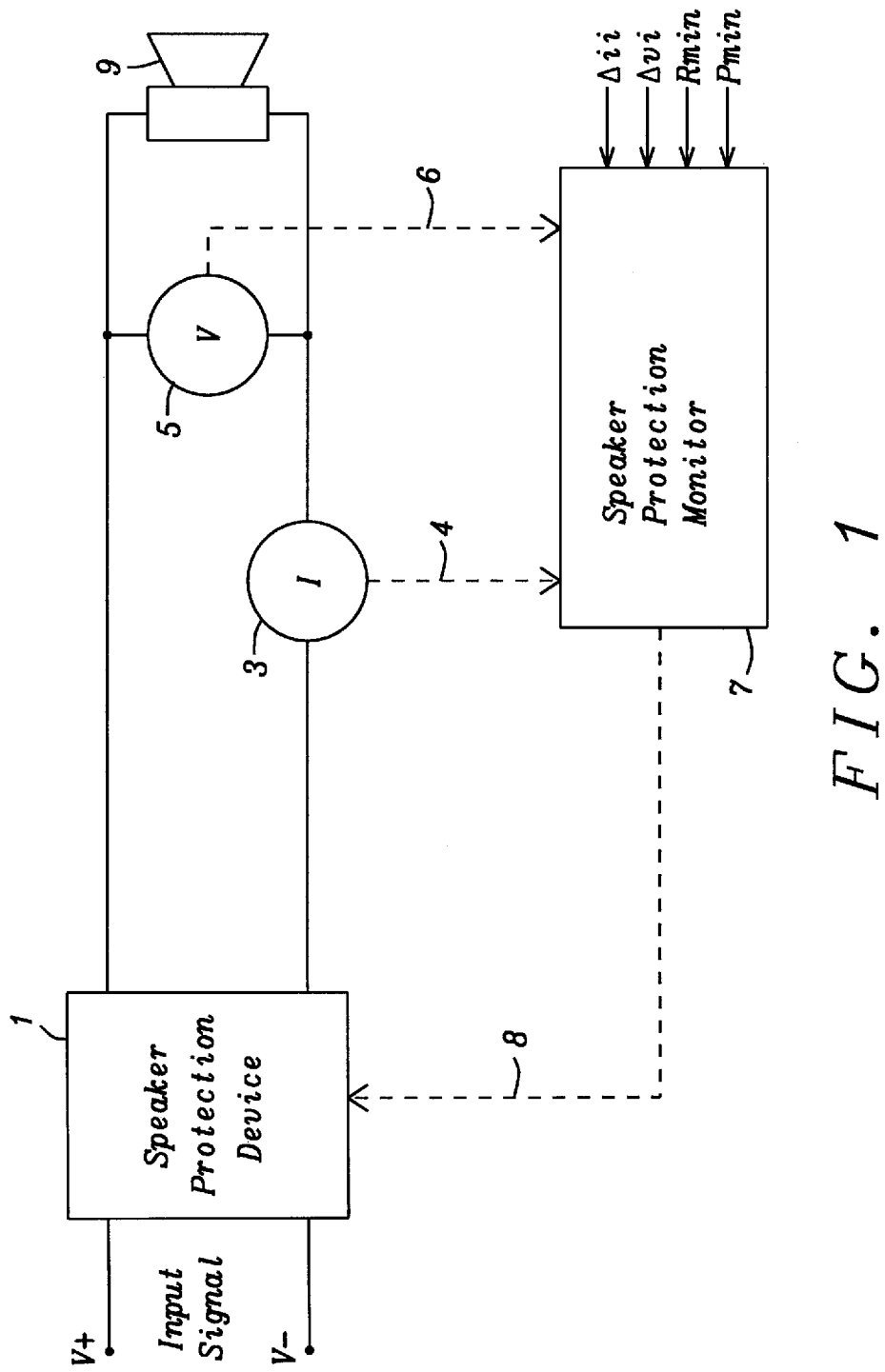
FIG. 1 shows a block diagram of the basic components of the system invented.

FIG. 1 shows a block diagram of the basic components of the system invented. It depicts a speaker protection device 1 receiving audio input signals V+ and V−. A voltage measuring device 5 measures an input voltage of the loudspeaker 9 and a current measuring device 3 measures an input current of the loudspeaker 9. The voltage measuring 5 provides a voltage signal 6, representing the voltage measured to a speaker protection monitor 7. The current measuring device 3 provides a current signal 4, representing the current measured to a speaker protection monitor 7.

Furthermore the speaker protection monitor 7 performs calculations to identify situations requiring actions to protect the loudspeaker 9. In order to monitor such situations speaker protection metric signals 8 are provided to activate the speaker protection device 1. These calculations will be outlined in detail below. The speaker protection monitor 7 is a processor.

The impedance measurement will be inaccurate when the input power is below a certain level. Hence the metric is never positive when the power is below Pmin. The Rmin is the minimum real impedance for the metric to become positive, indicating the speaker protection should be activated. For the metric to become positive, R>Rmin and P>Pmin.

The method invented assumes that instantaneous measurements of the current $i_m(t)$ through and voltage $v_m(t)$ over the loudspeaker terminals are available. In general the measured signals are generally not equal to the true current and voltage but will have an instantaneous error signals $e_i(t)$ and $e_v(t)$ The error signals are caused by noise in the current and voltage sensing devices.

$$i_m(t)=i(t)+e_i(t) \tag{1}$$

$$v_m(t)=v(t)+e_v(t) \tag{2}$$

These signals are each passed through a band-pass filter, leading to:

$$i_{m,bpf}(t)=i_{bpf}(t)+e_{i,bpf}(t) \tag{3}$$

$$v_{m,bpf}(t)=v_{bpf}(t)+e_{v,bpf}(t) \tag{4}$$

The band-pass filter can be a combination of a high-pass and low-pass filter, and can be implemented as an analog or digital circuit, for example as an IIR or FIR filter.

From these values the instantaneous products are obtained:

$$ii(t)=i_{m,bpf}(t) \cdot i_{m,bpf}(t) \tag{5}$$

$$iv(t)=i_{m,bpf}(t) \cdot v_{m,bpf}(t) \tag{6}$$

$$vv(t)=v_{m,bpf}(t) \cdot v_{m,bpf}(t) \tag{7}$$

These values are passed through an averaging filter, denoted as $< >$. This may be low-pass filter, such as leaky integrator filter, or digital filter such as a FIR, IIR or sliding average filter. The result after averaging can be expressed as:

$$<ii>=<i_{bpf}^2>+2<i_{bpf}e_{i,bpf}>+<e_{i,bpf}^2> \tag{8}$$

$$<iv>=<i_{bpf}v_{bpf}>+<i_{bpf}e_{v,bpf}>+<e_{i,bpf}v_{bpf}>+<e_{i,bpf}e_{v,bpf}> \tag{9}$$

$$<vv>=<v_{bpf}^2>+2<v_{bpf}e_{v,bpf}>+<e_{v,bpf}^2> \tag{10}$$

It should be noted that the current noise $<e_{i,bpf}^2>$ should be calibrated in advance. It is a single value, which is equal to the $<ibpf^2>$ with an input value of zero.

If there is no correlation between the actual current and voltage and the measurement noise, the cross terms with the noise, shown in the correspondent equation above, can be neglected. However, the autocorrelations of the noise terms will not vanish:

$$<ii> \sim <i_{bpf}^2>+<e_{i,bpf}^2> \tag{11}$$

$$<iv> \sim <i_{bpf}v_{bpf}> \tag{12}$$

If we assume the noise characteristics of the voltage and current measurements are known, then an accurate estimate of the true current and voltage correlations can be obtained as:

$$<i_{bpf}^2>_{est}=<i_{m,bpf}^2>-<e_{i,bpf}^2> \tag{13}$$

$$<i_{bpf}v_{bpf}>_{est}=<i_{m,bpf}v_{m,bpf}> \tag{14}$$

An estimate for the real part of the complex impedance can be computed as:

$$R_{est}=<i_{bpf}v_{bpf}>_{est}/<i_{bpf}^2>_{est} \tag{15}$$

Due to the power dissipated in the voice coil, its temperature will increase. This will result in a higher resistance. With the proposed method, a threshold value can be set for the maximum resistance (and hence the maximum temperature) that is allowed:

$$\text{Threshold1}(t)=<i_{bpf}v_{bpf}>_{est}-R_{min} \cdot <i_{bpf}^2>_{est} \tag{16}$$

Figure 2:
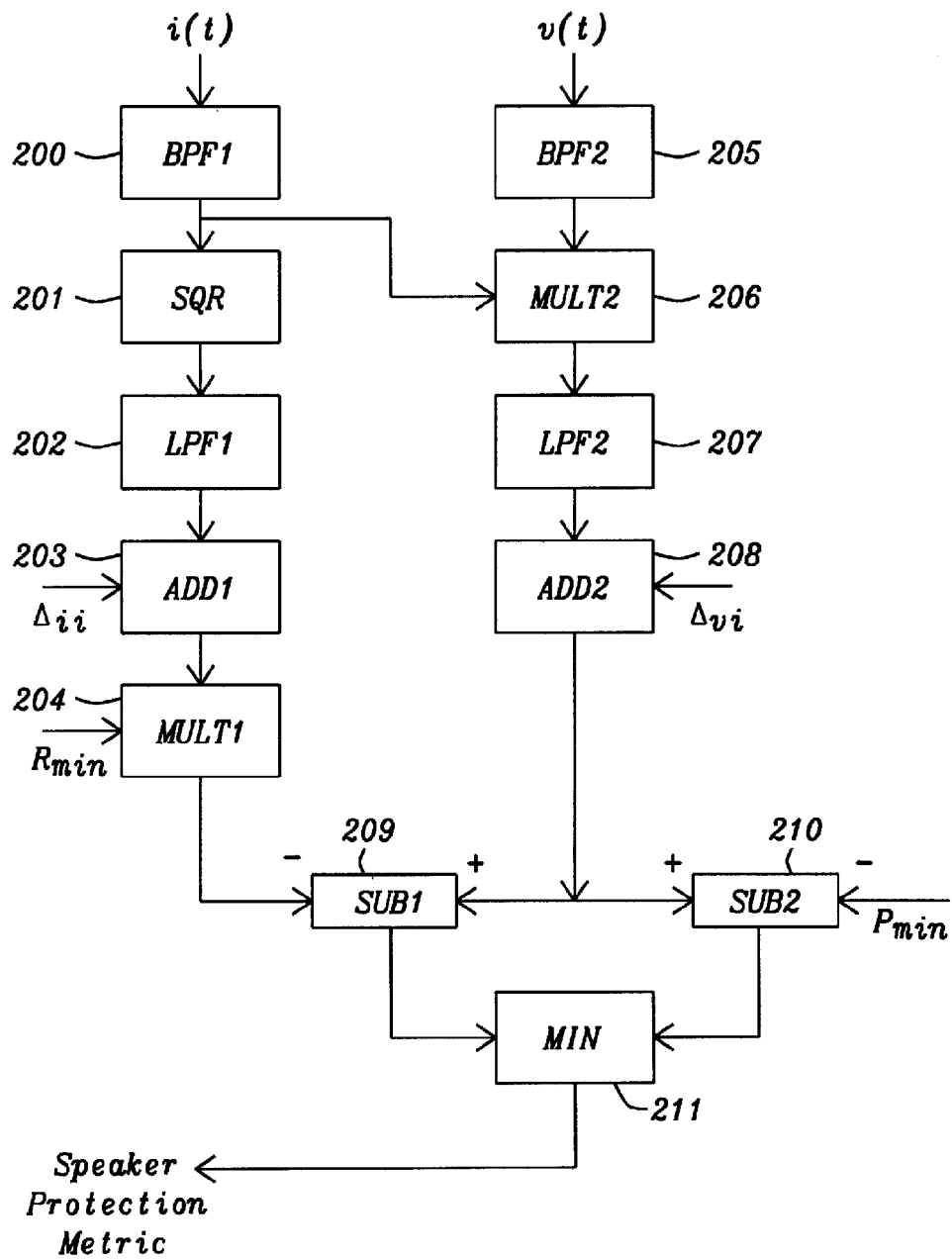
FIG. 2 shows a flowchart of the computational steps performed by the speaker protection monitor.

Threshold1 defined here is the output of the block SUB1 209 shown in FIG. 2.

Threshold2 is the output of block SUB2 210 and is defined:

$$\text{Threshold2}=<i_{bpf}v_{bpf}>_{est}-\text{Pmin}$$

Rmin is a user configurable value. It is related to the maximum allowed temperature, because $R(T)=R_0+\text{alpha}*R_0*(T-T_0)$, wherein alpha is the resistivity coefficient of the voice coil at reference temperature $T_0$, wherein the voice coil has a resistance $R_0$.

If threshold(t) is positive, the maximum resistance has been exceeded and the protection circuit 1 should be activated.

The objective of the protection circuit 1 is to lower the temperature of the voice coil, by either reducing the average power that is dissipated as heat, or by improving the cooling of the voice coil. Examples of such protection circuits are:

A hard or soft limiter, which reduces the maximum voltage on the loudspeaker terminals.

A gain controller, which attenuates the voltage on the loudspeaker terminals.

A shelving or low-pass filter, which selectively reduces the amplitude of the high frequency components in the audio signal.

A shelving or high-pass filter, which selectively reduces the amplitude of the low frequency components in the audio signal.

An active cooling device, such as a fan or Peltier element, which induces enhanced cooling.

Alternatively an additional voltage signal may be added to the loudspeaker terminals that induces large displacements of the voice coil. The large displacement will results in elevated air intake and hence enhanced cooling. If the frequency of the additional voltage signal is very low it will be practically inaudible.

FIG. 2 shows a flowchart of the steps performed by the speaker protection monitor 7.

Blocks 200 and 205 are acting as band-pass filters. Blocks 204 and 206 are multiplication blocks. Block 201 is enabled to square. Blocks 202 and 207 are acting as low-pass filters. Blocks 203 and 208 are adders. Blocks 209 and 210 are enabled to subtract, and block 211 is a comparing block determining, which result of blocks 209 and 210 is smaller.

In block 200 and 205 the steps according equations (3) and correspondently equation (4) are computed. Block 201 calculates equation (5) and block 206 calculates equations (6) and (7). Block 202 executes equation (8) and block 207 executes equations (9) and (10). Block 203 calculates equation (11) and block 208 calculates equation (12). Equation (13) is calculated by blocks 204 and 209.

The result of equation (14) is the output of LPF3 shown in FIG. 2. Equation (15) is not calculated, it is equivalent to equation 16, which is the output of block SUB1 209.

It should be noted that the preferred embodiment of the disclosure is hard-wired, but alternatively an implementation as a program executed by a processor is also possible.

Figure 3A:
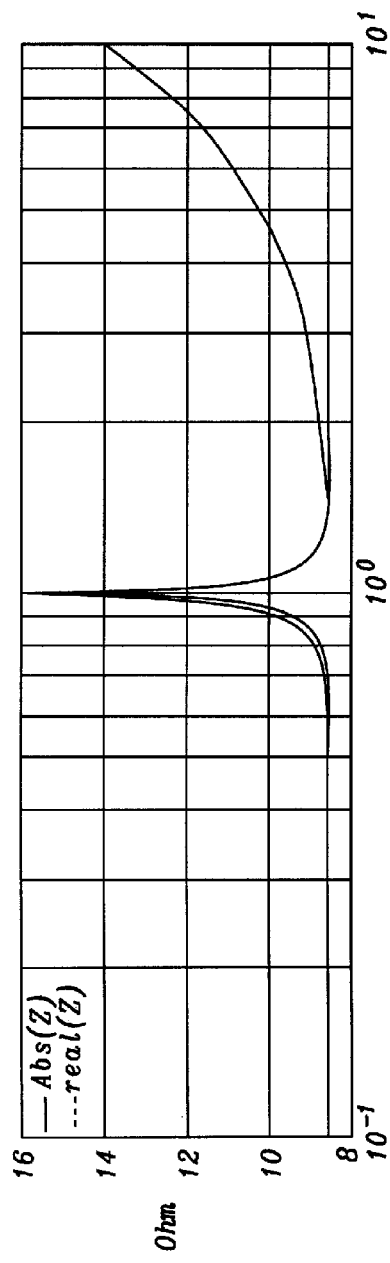
FIG. 3a shows simulation results of the impedance of loudspeaker as function of frequency.

FIG. 3a shows simulation results of the impedance of loudspeaker as function of frequency. Curve 30 shows the total impedance and curve 31 illustrates the real part of the impedance. The peak of 1 kHz is caused by a resonance in the loudspeaker.

The resonance peak will distort the speaker protection method. For this reason the band pass filters 200 and 201 must be chosen such that the resonance peak is not included in the pass band of the filters.

Figure 3B:
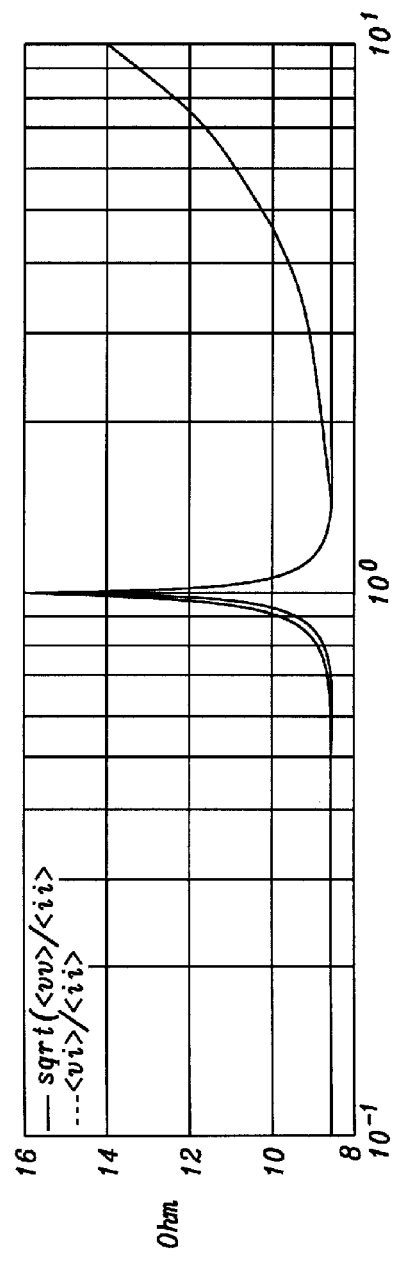
FIG. 3b shows simulation results of the square root ($<vv>/<ii>$) and of $<iv>/<ii>$ both as function of frequency.

FIG. 3b shows simulation results of the square root (<vv>/<ii>) 32 and of <iv>/<ii> 33 both as function of frequency. Both curves 32 and 33 demonstrate show the very close correlation between the factors sqrt (<vv>/<ii>) 32 and <iv>/<ii> 33 to the impedance curves shown in FIG. 3a.

Figure 4:
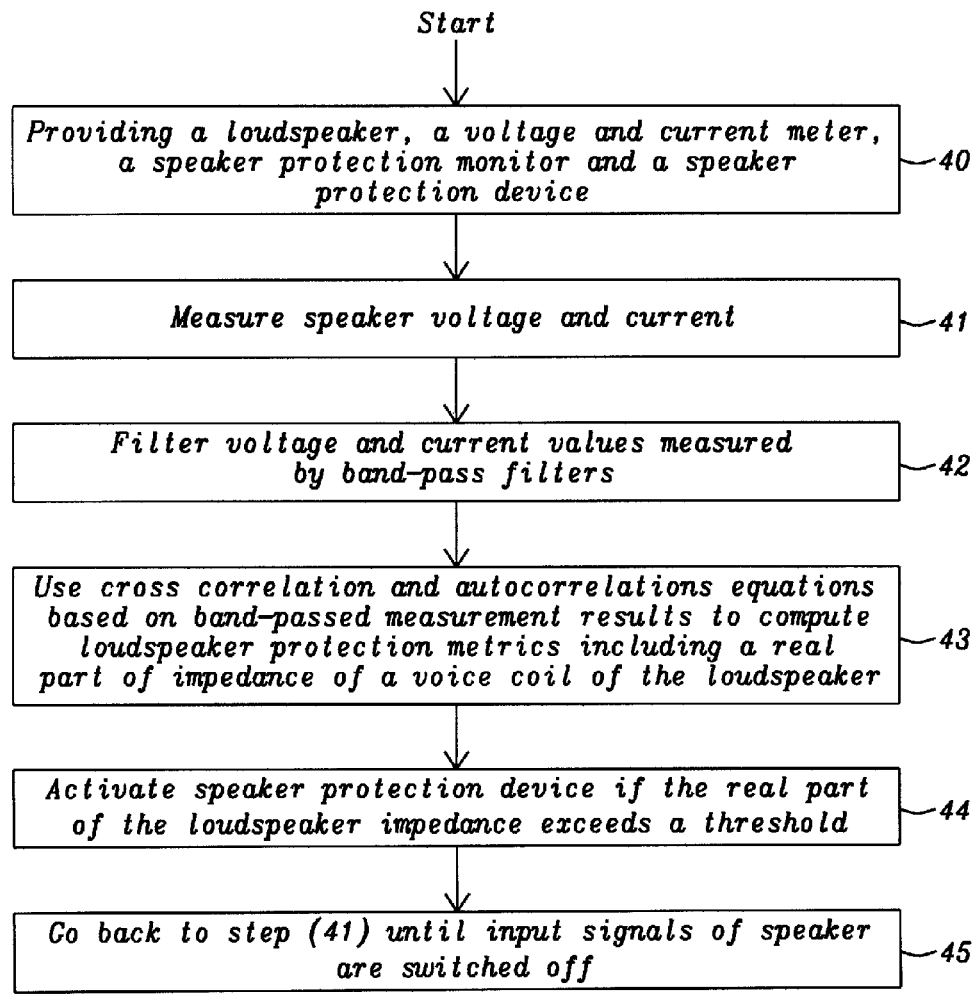
FIG. 4 illustrates a flowchart of key steps of the method for computing metric for loudspeaker protection invented.

FIG. 4 illustrates a flowchart of key steps of the method for computing metrics for loudspeaker protection invented. Step 40 illustrates providing a loudspeaker, a voltage and a current meter, a speaker protection monitor and a speaker protection device. Step 41 depicts measuring speaker input current and voltage. Step 42 shows filtering by band-pass filters speaker input voltage and current values measured. Step 43 teaches using cross-correlation and autocorrelations equations based on band-passed measurement results to compute loudspeaker protection metrics. Step 44 illustrates activating speaker protection device if the real part of the loudspeaker impedance exceeds a threshold, and finally step 45 shows going back to step (41) if input signals of speaker are active.

While the invention has been particularly shown and described with reference to the preferred embodiments thereof, it will be understood by those skilled in the art that various changes in form and details may be made without departing from the spirit and scope of the invention.

What is claimed is:

1. A method for computing metrics for loudspeaker protection, comprising the following steps:
    (1) providing a loudspeaker, a voltage and a current meter, a speaker protection monitor comprising computational and filtering means, and a speaker protection device;
    (2) measuring speaker input current and voltage;
    (3) filtering by band-pass filters speaker input voltage and current values measured wherein the band-pass filtered speaker input voltage and current values measured are described by the equations:

$$i_{m,bpf}(t) = i_{bpf}(t) + \epsilon_{i,bpf}(t), \text{ and}$$

$$v_{m,bpf}(t) = v_{bpf(t)} + \epsilon_{v,bpf}(t)$$

wherein $i_{m,bpf}(t)$ is the filtered input current, $i_{bpf}(t)$ is the input current measured, $\epsilon_{i,bpf}(t)$ describe the current error signals, $v_{m,mbpf}(t)$ describes is the filtered input voltage, $V_{bpf}(t)$ is the input voltage measured, and $\epsilon_{v,bpf}(t)$ describe the voltage error signals;
    (4) using cross-correlation and autocorrelations equations based on band-passed measurement results to compute loudspeaker protection metrics including a real part of impedance of a voice coil of the loudspeaker, wherein components of the cross-correlation and autocorrelations equations comprise following equations of instantaneous products required for computations of correlations:

$$ii(t) = i_{m,bpf}(t) \cdot i_{m,bpf}(t),$$

$$iv(t) = i_{m,bpf}(t) \cdot v_{m,bpf}(t), \text{ and}$$

$$vv(t) = v_{m,bpf}(t) \cdot v_{m,bpf}(t);$$

(5) activating speaker protection device if the real part of the loudspeaker impedance exceeds a threshold; and
    (6) going back to step (2) if input signals of speaker are active.

2. The method of claim 1 wherein said instantaneous products are passed through an averaging filter and the result after averaging can be expressed by following equations:

$$<ii> = <i_{bpf}^2> + 2<i_{bpf} \cdot \epsilon_{i,bpf}> + <\epsilon_{i,bpf}^2>,$$

$$<iv> = <i_{bpf} v_{bpf}> + <i_{bpf} \cdot \epsilon_{v,bpf}> + <\epsilon_{i,bpf} v_{bpf}> + <\epsilon_{i,bpf} \cdot \epsilon_{v,bpf}>, \text{ and}$$

$$<vv> = <v_{bpf}^2> + 2<v_{bpf} \cdot \epsilon_{v,bpf}> + <\epsilon_{v,bpf}^2>.$$

3. The method of claim 2 wherein said averaging filter is a low-pass filter.

4. The method of claim 3 wherein said low-pass filter is a leaky integrator filter.

5. The method of claim 2 wherein said averaging filter is a digital filter.

6. The method of claim 5 wherein said digital filter is a FIR filter, an IIR filter, or a sliding average filter.

7. The method of claim 2 wherein said equations can be simplified by the following approximations:

$$<ii> = <i_{bpf}^2> + <\epsilon_{i,bpf}^2>, \text{ and}$$

$$<iv> = <i_{bpf} v_{bpf}>.$$

8. The method of claim 7 wherein accurate estimations of true current and voltage correlations are:

$$<i_{bpf}^2>est = <i_{m,bpf}^2> - <\epsilon_{i,bpf}^2>, \text{ and}$$

$$<i_{bpf} v_{bpf}>est = <i_{m,bpf} v_{m,bpf}>.$$

9. The method of claim 8 wherein based on said estimations of true current and voltage correlations an estimate of the real part of the impedance of the voice coil can be computed following the equation:

$$R_{est} = <i_{bpf} v_{bpf}>est / <i_{bpf}^2>est,$$

wherein $R_{est}$ is the real part of the impedance of the voice coil.

10. The method of claim 8 wherein said threshold can be calculated using an equation:

$$\text{threshold}(t) = <i_{bpf} v_{bpf}>est - R_{min} \times <i_{bpf}^2>est$$

wherein, if threshold(t) is positive, a maximum allowable resistance of the voice coil is exceeded and the speaker protection device is activated.

11. The method of claim 1 wherein the speaker protection device, if activated, is lowering a temperature of the voice coil.

12. The method of claim 11 wherein the speaker protection device, if activated, is improving a cooling of the voice coil.

13. The method of claim 11 wherein the speaker protection device, if activated, is lowering the temperature of the voice coil by reducing an average power that is dissipated as heat at the voice coil.

14. A system for preventing any damage of a loudspeaker because of over-heating of a voice coil comprising:
    a voltage meter capable of measuring a signal input voltage of the loudspeaker and transmitting voltage measurement results to a speaker protection monitor and a current meter measuring a signal input current of the loudspeaker and transmitting current measurement results to a speaker protection monitor;
    the speaker protection monitor configured to using cross-correlation and autocorrelations equations based on band-passed measurement results of loudspeaker voltage and loudspeaker current and to compute loudspeaker protection metrics, wherein the speaker protection monitor comprises a band-pass filter configured to filtering speaker input voltage and current values measured wherein the band-pass filtered speaker input voltage and current values measured are described by the equations:

$$i_{m,bpf}(t) = i_{bpf}(t) + \epsilon_{i,bpf}(t), \text{ and}$$

$$v_{m,bpf}(t) = v_{bpf}(t) + \epsilon_{v,bpf}(t)$$

wherein $i_{m,bpf}(t)$ is the filtered input current, $i_{bpf}(t)$ is the input current measured, $\epsilon_{i,bpf}(t)$ describe the current error signals, $v_{m,bpf}(t)$ describes is the filtered input voltage, $v_{bpf}(t)$ is the input voltage measured, and $\epsilon_{v,bpf}(t)$ describe the voltage error signals; and a speaker protection device capable of lowering a temperature of the voice coil, if activated by the speaker protection monitor.

15. The system of claim 14 wherein the speaker protection monitor is implemented on a hard-wired basis.

16. The system of claim 14 wherein the speaker protection monitor is implemented by a program executed by a processor.

17. The system of claim 14 wherein said speaker protection monitor further comprising:
   an averaging filter;
   an output port configured to to transmit a signal to a speaker protection device in order to activate the speaker protection device if required; and
   means to compute cross correlation and autocorrelation calculations comprising computing the loudspeaker threshold.

18. The system of claim 14 wherein the loudspeaker protection metrics are including a real part of impedance of a voice coil of the loudspeaker.

19. The system of claim 18 wherein the activating speaker protection device are activated if the real part of the loudspeaker impedance exceeds a threshold.

20. A system for preventing any damage of a loudspeaker because of over-heating of a voice coil comprising:
   a loudspeaker comprising at least one voice coil and two signal input ports;
   a voltage meter configured to measuring a signal input voltage of the loudspeaker and transmitting voltage measurement results to a speaker protection monitor;
   a current meter configured to measuring a signal input current of the loudspeaker and transmitting current measurement results to a speaker protection monitor;
   said speaker protection monitor comprising:
   one or more band-pass filters configured to filtering speaker input voltage and current values measured wherein the band-pass filtered speaker input voltage and current values measured are described by the equations:

$$i_{m,bpf}(t) = i_{bpf}(t) + \epsilon_{i,bpf}(t), \text{ and}$$

$$v_{m,bpf}(t) = v_{bpf}(t) + \epsilon_{v,bpf}(t)$$

wherein $i_{m,bpf}(t)$ is the filtered input current, $i_{bpf}(t)$ is the input current measured, $\epsilon_{i,bpf}(t)$ describe the current error signals, $v_{m,bpf}(t)$ describes is the filtered input voltage, $v_{bpf}(t)$ is the input voltage measured, and $\epsilon_{v,bpf} t$ describe the voltage error signals;
   one or more averaging filters;
   an output port capable of to transmit a signal to a speaker protection device in order to activate the speaker protection device if required; and
   means to compute cross correlation and autocorrelation calculations comprising computing the loudspeaker threshold; and
   said speaker protection device capable of lowering, if activated, a temperature of the voice coil.

21. The system of claim 20 wherein each of said one or more band-pass filters is a combination of a high-pass filter and of a low-pass filter.

22. The system of claim 20 wherein said one or more band-pass filters are implemented as digital filter.

23. The system of claim 20 wherein the band pass filters are chosen such that a resonance peak of the loudspeaker is not included in a pass band of the band pass filter.

24. The system of claim 20 wherein said one or more averaging filters are low-pass filter.

25. The system of claim 24 wherein said one or more low-pass filter are a leaky integrator filter.

26. The system of claim 24 wherein said one or more averaging filters are digital filters.

27. The system of claim 20 wherein said speaker protection device is a hard or soft limiter, which reduces the maximum voltage on the loudspeaker terminals.

28. The system of claim 20 wherein said speaker protection device is a gain controller, which attenuates the voltage on the loudspeaker terminals.

29. The system of claim 20 wherein said speaker protection device is a shelving or low-pass filter, which selectively reduces the amplitude of the high frequency components in the audio signal.

30. The system of claim 20 wherein said speaker, protection device is a shelving or high-pass filter, which selectively reduces the amplitude of the low frequency components in the audio signal.

31. The system of claim 20 wherein said speaker protection device is an active cooling device, such as a fan or Peltier element, which induces enhanced cooling.

32. The system of claim 20 wherein said speaker protection device adds an additional voltage signal to the loudspeaker terminals that induces large displacements of the voice coil.

33. The system of claim 20 wherein said means to compute cross correlation and autocorrelation calculations comprise:
   blocks processing the current measurement signals comprising
      a band-pass filter block;
      a block enabled to square;
      a low-pass filter block;
      a first adder; and
      a first multiplying block;
   blocks processing the voltage measurement signals comprising:
      a band-pass filter block;
      a second multiplying block;
      a low-pass filter block; and
      a second adder; and
   blocks processing results of said both voltage and current processing blocks comprising:
      a first and a second subtracting block; and
      a comparing block.

* * * * *